United States Patent
Takeshita et al.

(10) Patent No.: US 9,059,368 B2
(45) Date of Patent: Jun. 16, 2015

(54) SEMICONDUCTOR DEVICE AND METHOD FOR MANUFACTURING THE SAME

(71) Applicant: KABUSHIKI KAISHA TOSHIBA, Minato-Ku, Tokyo (JP)

(72) Inventors: Atsushi Takeshita, Fukuoka (JP); Hidetomo Tanaka, Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/320,366

(22) Filed: Jun. 30, 2014

(65) Prior Publication Data

US 2014/0315337 A1   Oct. 23, 2014

Related U.S. Application Data

(62) Division of application No. 13/425,232, filed on Mar. 20, 2012, now abandoned.

(30) Foreign Application Priority Data

Oct. 11, 2011   (JP) .................................. 2011-224285

(51) Int. Cl.
*H01L 31/18* (2006.01)
*H01L 33/00* (2010.01)
(Continued)

(52) U.S. Cl.
CPC .............. *H01L 31/18* (2013.01); *H01L 33/005* (2013.01); *H01L 31/0203* (2013.01); *H01L 31/173* (2013.01)

(58) Field of Classification Search
CPC ................. H01L 2924/00014; H01L 2924/00; H01L 2224/48091; H01L 2224/48247; H01L 2924/3025

USPC ....................... 257/82, E25.032, E31.108, 81
See application file for complete search history.

(56) References Cited

U.S. PATENT DOCUMENTS 4,047,045 A * 9/1977 Paxton et al. ................ 250/551
6,507,048 B1   1/2003 Makiya
(Continued)

FOREIGN PATENT DOCUMENTS

JP   2002237615 A   8/2002

OTHER PUBLICATIONS

Japanese Office Action dated Apr. 17, 2014, filed in Japanese counterpart Application No. 2011-224285, 3 pages (with translation).
(Continued)

*Primary Examiner* — David Vu
*Assistant Examiner* — Jonathan Han
(74) *Attorney, Agent, or Firm* — Patterson & Sheridan, LLP

(57) ABSTRACT

According to one embodiment, a semiconductor device includes first, second, and third molded bodies. The first molded body covers a first light emitting element, a part of a lead electrically connected to the first light emitting element, a first light receiving element configured to detect a light emitted from the first light emitting element, and a part of a lead electrically connected to the first light receiving element with a first resin. The second molded body covers a second light emitting element, a part of a lead electrically connected to the second light emitting element, a second light receiving element configured to detect a light emitted from the second light emitting element, and a part of a lead electrically connected to the second light receiving element with the first resin. The third molded body molds the first and the second molded bodies as one body using a second resin.

7 Claims, 7 Drawing Sheets

(51) Int. Cl.
*H01L 31/0203* (2014.01)
*H01L 31/173* (2006.01)

(56) References Cited

U.S. PATENT DOCUMENTS

| | | | | |
|---|---|---|---|---|
| 6,588,946 | B1 * | 7/2003 | Mitsui | 385/92 |
| 2008/0159691 | A1 * | 7/2008 | Aki | 385/24 |
| 2010/0171127 | A1 * | 7/2010 | Kanatake | 257/81 |
| 2010/0193803 | A1 * | 8/2010 | Liu et al. | 257/81 |
| 2010/0270483 | A1 * | 10/2010 | Omura | 250/551 |

OTHER PUBLICATIONS

Japanese Office Action dated Aug. 19, 2014, filed in Japanese counterpart Application No. 2011-224285, 3 pages (with translation).

* cited by examiner

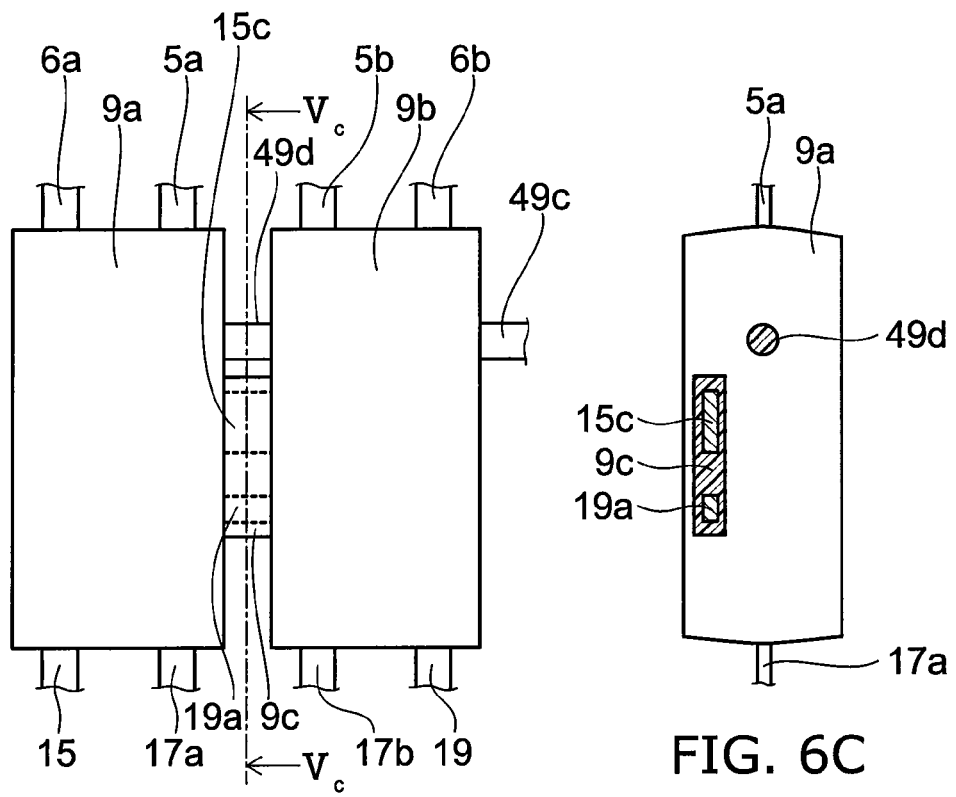
FIG. 6A
FIG. 6C
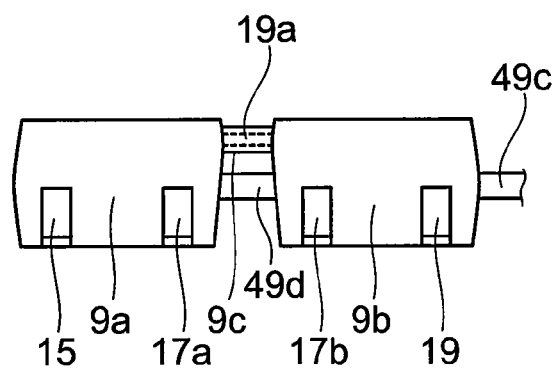
FIG. 6B

SEMICONDUCTOR DEVICE AND METHOD FOR MANUFACTURING THE SAME

CROSS-REFERENCE TO RELATED APPLICATIONS

This application is a divisional of U.S. patent application Ser. No. 13/425,232, filed Mar. 20, 2012, which is based upon and claims the benefit of priority from Japanese Patent Application No. 2011-224285, filed on Oct. 11, 2011; the entire contents of which are incorporated herein by reference.

FIELD

Embodiments described herein relate generally to a semiconductor device and a method for manufacturing the same.

BACKGROUND

A photocoupler, for example, which is a semiconductor device, includes a light emitting element and a light receiving element built-in and transmits a signal by an optical coupling. Therefore, the photocoupler is used for an isolation circuit that electrically insulates the primary side and the secondary side. Although the photocoupler has various uses, high insulating properties between the light emitting element on the primary side and the light receiving element on the secondary side are required in common. In addition, in a dual type product that includes two sets of a light emitting element and a light receiving element and has two transmission channels, it is necessary to suppress a crosstalk between channels.

For example, in a product in which the light receiving element side is connected to one frame, fabrication becomes easier by employing a method in which two sets of a light emitting element and a light receiving element are encapped by a one-body resin, but the crosstalk between channels cannot be suppressed. There is also a method in which two sets of a light emitting element and a light receiving element are individually encapped and are molded by a light blocking resin. The crosstalk can be suppressed by this method. However, a gap may be formed at the interface between the encap and the mold resin, and the dielectric breakdown voltage may be decreased. Thus, a semiconductor device in which the crosstalk between channels can be suppressed and the dielectric breakdown voltage can be increased and a method for manufacturing the same are required.

BRIEF DESCRIPTION OF THE DRAWINGS

FIGS. 6A to 6C are schematic views subsequent to FIG. 5B; and

DETAILED DESCRIPTION

Figure 1A:
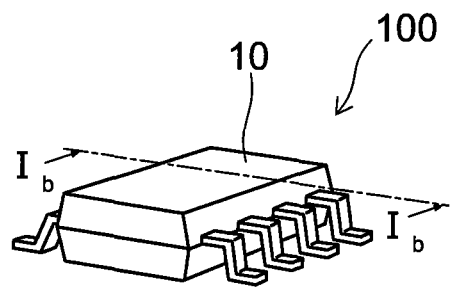
FIGS. 1A and 1B are schematic views showing a semiconductor device according to an embodiment.

According to one embodiment, a semiconductor device including: a first molded body, a second molded body, and a third molded body. The first molded body covers a first light emitting element, a part of a primary lead electrically connected to the first light emitting element, a first light receiving element configured to detect a light emitted from the first light emitting element, and a part of a secondary lead electrically connected to the first light receiving element with a first resin. The second molded body covers a second light emitting element, a part of a primary lead electrically connected to the second light emitting element, a second light receiving element configured to detect a light emitted from the second light emitting element, and a part of a secondary lead electrically connected to the second light receiving element with the first resin. The third molded body molds the first molded body and the second molded body as one body using a second resin. One of the primary lead and the secondary lead is disposed to extend over the first molded body and the second molded body, and a surface of a portion extending between the first molded body and the second molded body is covered with a thin film made of the first resin.

Various embodiments will be described hereinafter with reference to the accompanying drawings. Identical components in the drawings are marked with the same reference numerals, and a detailed description thereof is omitted as appropriate and different components are described.

Figure 1B:
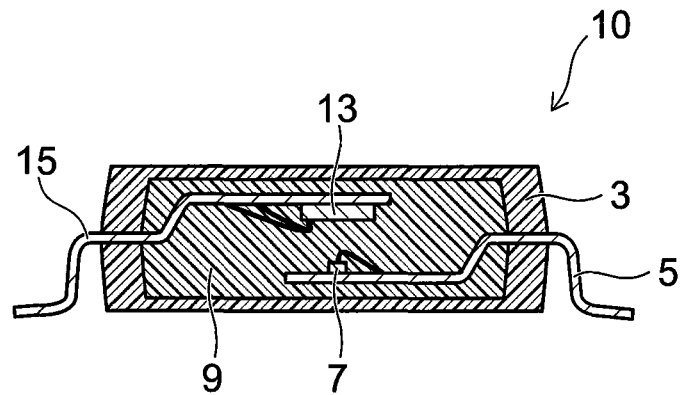

FIGS. 1A and 1B are schematic views showing a semiconductor device 100 according to an embodiment. FIG. 1A is a perspective view showing an external appearance, and FIG. 1B is a cross-sectional view taken along line $I_b$-$I_b$ shown in FIG. 1A.

The semiconductor device 100 is, for example, a photocoupler, and includes a light emitting element and a light receiving element built-in. As shown in FIG. 1A, the semiconductor device 100 includes a resin package 10 and a plurality of terminals (leads) extending from the resin package 10.

As shown in FIG. 1B, a light emitting element 7 and a light receiving element 13 are fixed to leads 5 and 15, respectively, disposed away from each other, and are enclosed in the resin package 10. The light emitting element 7 fixed to the lead 5 and the light receiving element 13 fixed to the lead 15 are disposed opposed to each other. That is, the light emitting surface of the light emitting element 7 and the light receiving surface of the light receiving element 13 are disposed opposed to each other, and the light receiving element 13 detects the signal light that the light emitting element 7 emits.

The resin package 10 includes an internal mold 9 enclosing the light emitting element 7 and the light receiving element 13 and an external mold 3 covering the exterior of the internal mold 9. The internal mold 9 is made of, for example, a transparent resin; and transmits the light that the light emitting element 7 emits and causes the light to be incident on the light receiving surface of the light receiving element 13. On the other hand, the external mold 3 is made of a resin that blocks the external light; and suppresses a dark current of the light receiving element 13 and reduces the noise level.

The transparent resin used for the internal mold 9 preferably transmits 100% of the light emitted from the light emitting element 7, but may absorb part of it. For example, an epoxy resin may be used.

A resin having the same main component as the internal mold 9 is preferably used for the external mold 3. Thereby, the adhesion between the internal mold 9 and the external mold 3 can be improved. In the resin forming the external mold 3, members that absorb the external light are scattered. For example, what is called a black resin in which carbon is scattered in an epoxy resin may be used. Furthermore, what is called a white resin in which members that reflect the external light are scattered may be used. For example, an epoxy resin in which a fine powder of titanium oxide is scattered may be used. Here, the external light refers to the background light excluding the light that the light emitting element 7 emits, for example, refers to light in a wavelength range in which the light receiving element 13 has sensitivity.

Figure 2A:
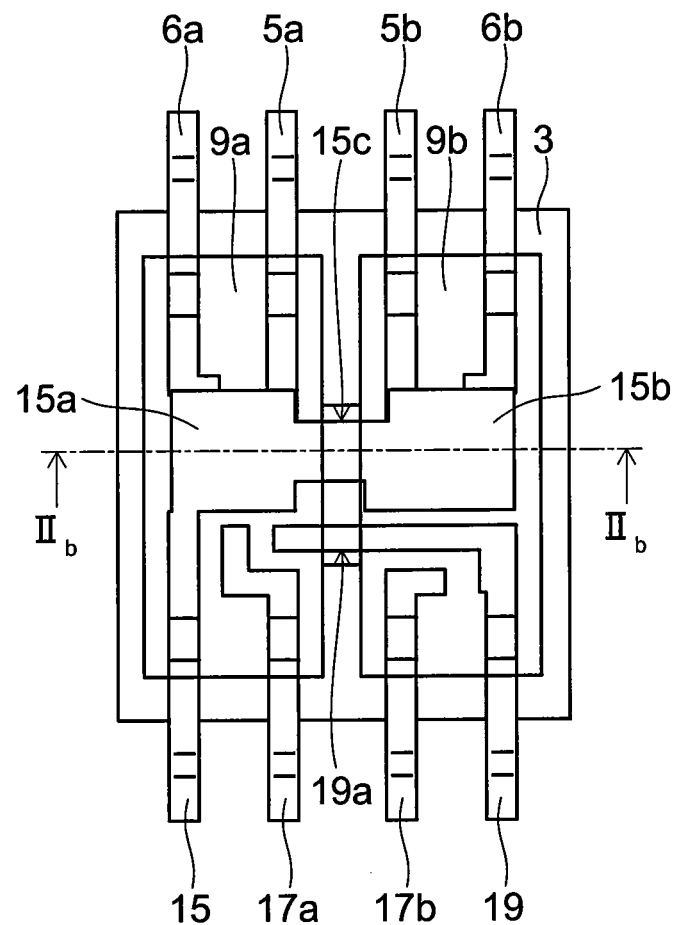
FIGS. 2A and 2B are schematic views showing the semiconductor device according to the embodiment.
Figure 2B:
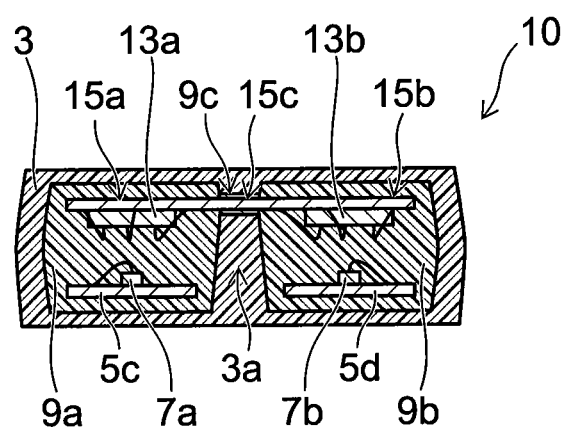

FIG. 2A is an opened-up view of the semiconductor device 100 as viewed from the upper surface. FIG. 2B is a cross-sectional view taken along line $II_b$-$II_b$ in FIG. 2A. The semiconductor device 100 according to the embodiment includes two sets of the light emitting element 7 and the light receiving element 13, and transmits signals of two channels.

As shown in FIG. 2A, the lead 15 to which the light receiving element 13 is fixed includes a first mount portion 15a and a second mount portion 15b (hereinafter a mount portion 15a and a mount portion 15b). The lead 15 further includes a portion connected to the mount portion 15a and extending to the outside of the resin package 10. Furthermore, two leads 17a and 17b that output a signal detected by the light receiving element 13 are provided. In addition, a lead 19 that supplies an electric power to the light receiving element 13 is provided.

On the other hand, the light emitting element 7 is fixed to leads 5a and 5b (see FIG. 3A) disposed opposed to the mount portion 15a and the mount portion 15b, respectively. Furthermore, leads 6a and 6b electrically connected to the light emitting element 7 via a metal wire are provided.

Thus, in the semiconductor device 100, the leads 5a, 5b, 6a, and 6b that supply a drive current to the light emitting element 7 are provided as leads on the primary side. On the other hand, the leads 15, 17a, 17b, and 19 are provided on the secondary side where a signal is outputted from the light receiving element 13.

As shown in FIG. 2B, a light receiving element 13a that is a first light receiving element is fixed to the mount portion 15a of the lead 15, and a light receiving element 13b that is a second light receiving element is fixed to the mount portion 15b. On the other hand, a light emitting element 7a that is a first light emitting element is fixed to a mount portion 5c connected to the lead 5a, and a light emitting element 7b that is a second light emitting element is fixed to a mount portion 5d connected to the lead 5b. The light emitting surface of the light emitting element 7a and the light receiving surface of the light receiving element 13a are disposed opposed to each other, and the light emitting surface of the light emitting element 7b and the light receiving surface of the light receiving element 13b are disposed opposed to each other.

The light receiving element 13a fixed to the mount portion 15a and the light emitting element 7a fixed to the lead 5a are enclosed in an internal mold 9a that is a first molded body using a first resin. The light receiving element 13b fixed to the mount portion 15b and the light emitting element 7b fixed to the lead 5b are enclosed in an internal mold 9b that is a second molded body using the first resin. The first resin is the transparent resin described above.

The internal molds 9a and 9b are covered with the external mold 3 that is a third molded body. The external mold 3 is molded by a second resin having light blocking properties. A shield portion 3a is provided between the internal mold 9a and the internal mold 9b. The shield portion 3a blocks the light of the light emitting element 7a propagated toward the light receiving element 13b, and blocks the light of the light emitting element 7b propagated toward the light receiving element 13a. Thereby, the crosstalk between channels is suppressed.

A connection portion 15c that is part of the lead 15 and connects the mount portion 15b and the mount portion 15a is covered with a thin film 9c made of the same first resin as that of the internal molds 9a and 9b. In the embodiment, the internal molds 9a and 9b are made of the same resin connected via the thin film 9c, and are in a state of enclosing the lead 15 therein. Also the leads 5a and 5b to which the light emitting elements 7a and 7b, respectively, are fixed are enclosed in the same resin.

Furthermore, as shown in FIG. 2A, also the lead 19 that supplies an electric power to the light receiving elements 13a and 13b is provided to extend over the internal molds 9a and 9b. The lead 19 includes a portion enclosed in the internal mold 9a, a portion enclosed in the internal mold 9b, and a connection portion 19a connecting them. Also the connection portion 19a is covered with the thin film 9c. That is, on the connection portion of the lead enclosed to extend over the internal molds 9a and 9b, the thin film 9c covering the surface of the connection portion is provided.

Thereby, the dielectric breakdown voltage between the leads 5a, 5b, 6a, and 6b provided on the primary side and the leads 15, 17a, 17b, and 19 provided on the secondary side can be increased.

Figure 3A:
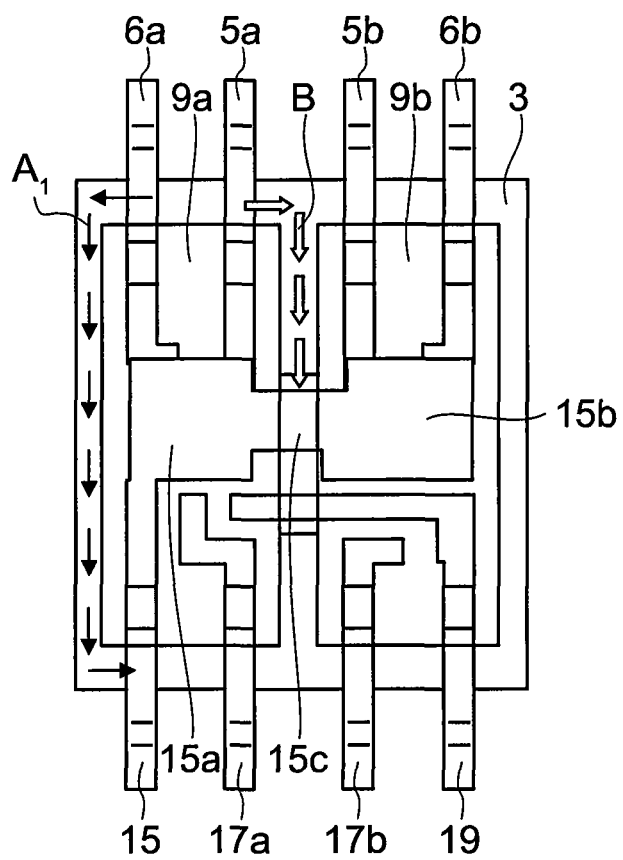
FIGS. 3A and 3B are schematic views illustrating a path of a current leak of the semiconductor device according to the embodiment.
Figure 3B:
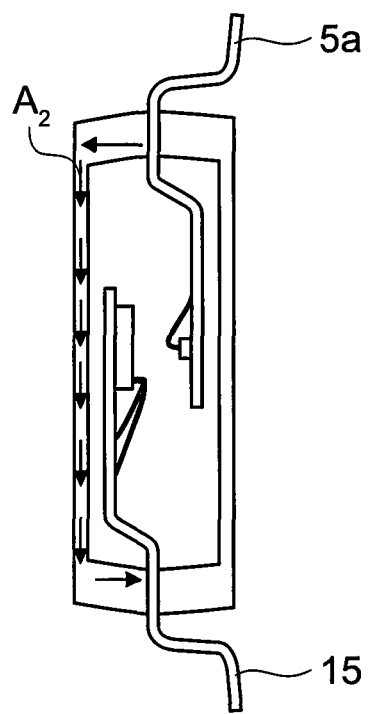

FIGS. 3A and 3B are schematic views illustrating a path of a current leak between the leads 5a and 6a and the lead 15. For example, if it is assumed that the dielectric breakdown voltage of the resin forming the internal molds 9a and 9b and the external mold 3 is sufficiently high, a path of a current leak will be formed at the interface between the internal mold 9a or 9b and the external mold 3. That is, the adhesion between the internal molds 9a and 9b and the external mold 3 may be reduced, and water that has entered from the outside may reduce the insulating properties.

As shown in FIG. 3A, for example, a path $A_1$ along the interface between the internal mold 9a and the external mold 3 may be formed as a leak path between the lead 6a and the lead 15. Furthermore, as shown in FIG. 3B, a path $A_2$ between the lead 5a and the lead 15 may be formed.

In contrast, in the case where, for example, the thin film 9c covering the connection portion 15c does not exist, the connection portion 15c is in a state of extending from the internal mold 9a to the external mold 3 across the interface and further being inserted from the external mold 3 into the internal mold 9b across the interface. Hence, for example, as shown in FIG. 3A, a leak path B will be formed between the lead 5a and the connection portion 15c of the lead 15.

The distance between the lead 5a and the connection portion 15c in the leak path B, what is called the creeping distance, is shorter than the creeping distance of the path $A_1$ or $A_2$. Therefore, the insulation resistance of the path B is smaller than the insulation resistance of the path $A_1$ or $A_2$. Consequently, in the case where the thin film 9c covering the connection portion 15c of the lead 15 is not provided, the dielectric breakdown voltage between the lead 6a and the lead 5a on the primary side and the lead 15 on the secondary side is decreased.

Thus, by covering the connection portions 15c and 19a of the leads provided to extend over the internal mold 9a and the internal mold 9b with the thin film 9c, the path B with a short creeping distance can be eliminated, and the creeping distance between leads can be extended. Thereby, the dielectric breakdown voltage of the semiconductor device 100 can be increased.

Figure 4A:
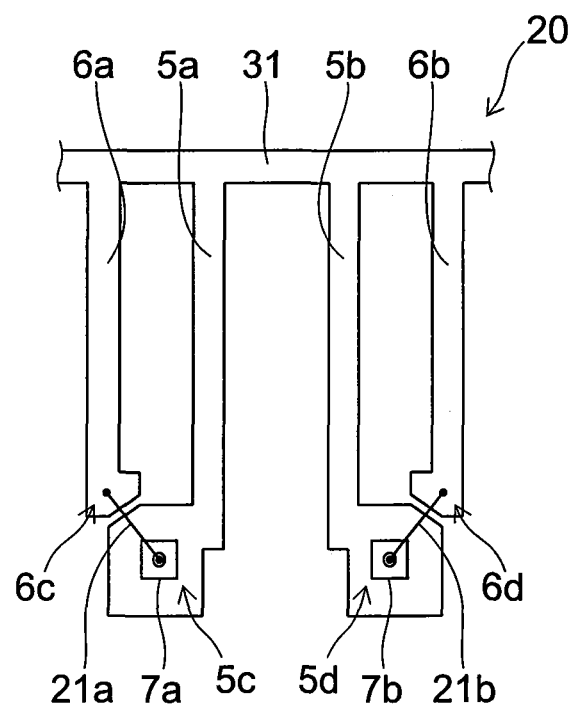
FIGS. 4A and 4B are schematic views showing a lead frame according to the embodiment.
Figure 4B:
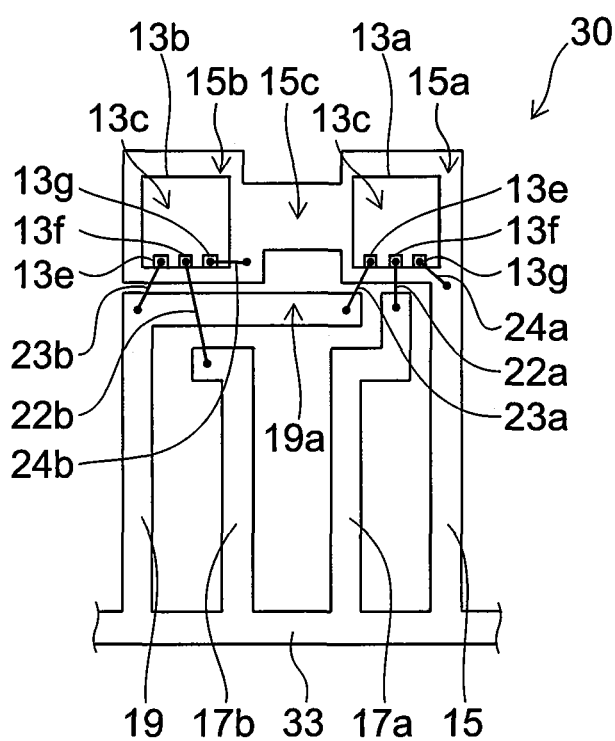

Next, the manufacturing processes for the semiconductor device 100 are described with reference to FIG. 4A to FIG. 7B. FIGS. 4A and 4B are schematic views showing lead frames used in the manufacturing of the semiconductor device 100. FIG. 5A to FIG. 7B are schematic views showing states of the lead frames in the processes.

FIG. 4A shows a state where the light emitting elements 7a and 7b are fixed to a lead frame 20 that is a first frame. FIG. 4B shows a state where the light receiving elements 13a and 13b are fixed to a lead frame 30 that is a second lead frame.

In the lead frame 20 shown in FIG. 4A, a first to a fourth lead extending from a common frame 31 are provided. The ends of the first to fourth leads are provided away from one another. At the end of the lead 5a that is the first lead, the mount portion 5c is provided and the light emitting element 7a is fixed. The lead 6a that is the second lead is electrically connected to the light emitting element 7a via a first wire 21a. On the other hand, at the end of the lead 5b that is the third lead, the mount portion 5d is provided and the light emitting element 7b is fixed. The lead 6b that is the fourth lead is electrically connected to the light emitting element 7b via a second wire 21b.

The light emitting elements 7a and 7b are, for example, fixed to the mount portions 5c and 5d, respectively, via a conductive silver (Ag) paste. The wires 21a and 21b are, for example, gold (Au) wires, and are bonded between the electrodes of the light emitting elements 7a and 7b and the ends 6c and 6d of the leads 6a and 6b, respectively.

In the lead frame 30 shown in FIG. 4B, four leads extending from a common frame 33 are provided. The four leads include a fifth to a seventh lead, and the ends of them are provided away from one another.

The mount portions 15a and 15b are provided at the end of the lead 15 that is the fifth lead. The light receiving element 13a is fixed to the mount portion 15a, and the light receiving element 13b is fixed to the mount portion 15b. The light receiving elements 13a and 13b may be fixed via, for example, an adhesive resin or an Ag paste. In the case where the light receiving elements 13a and 13b are silicon devices, they may be fixed via a silicide layer between the surface of the lead 15 and the back surfaces of the light receiving elements 13a and 13b.

The light receiving elements 13a and 13b each include a light receiving surface 13c, a power supply terminal 13e, a signal terminal 13f, and a ground terminal 13g. The power supply terminal 13e is connected to the lead 19 via wires 23a and 23b. The signal terminal 13f of the light receiving element 13a is connected to the lead 17a that is the sixth lead via a third wire 22a. The signal terminal 13f of the light receiving element 13b is connected to the lead 17b that is the seventh lead via a fourth wire 22b. Furthermore, the ground terminal 13g is connected to the lead 15 via wires 24a and 24b. The wires 22 to 24 are, for example, Au wires.

Figure 5A:
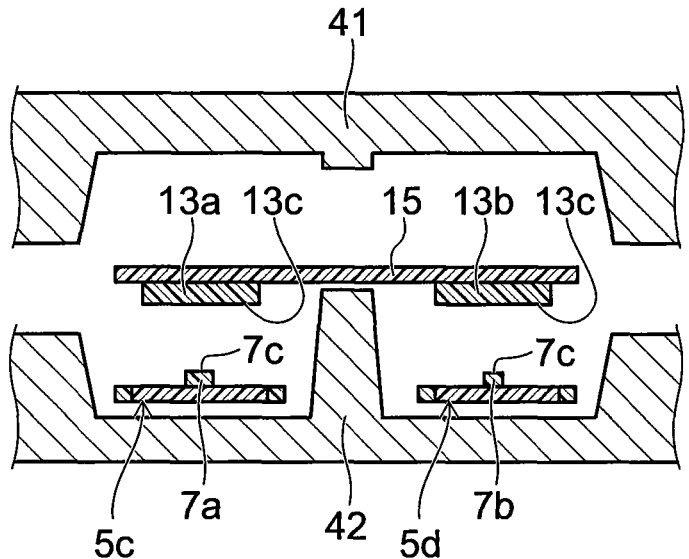
FIGS. 5A and 5B are schematic views showing a manufacturing process of the semiconductor device according to the embodiment.
Figure 5B:
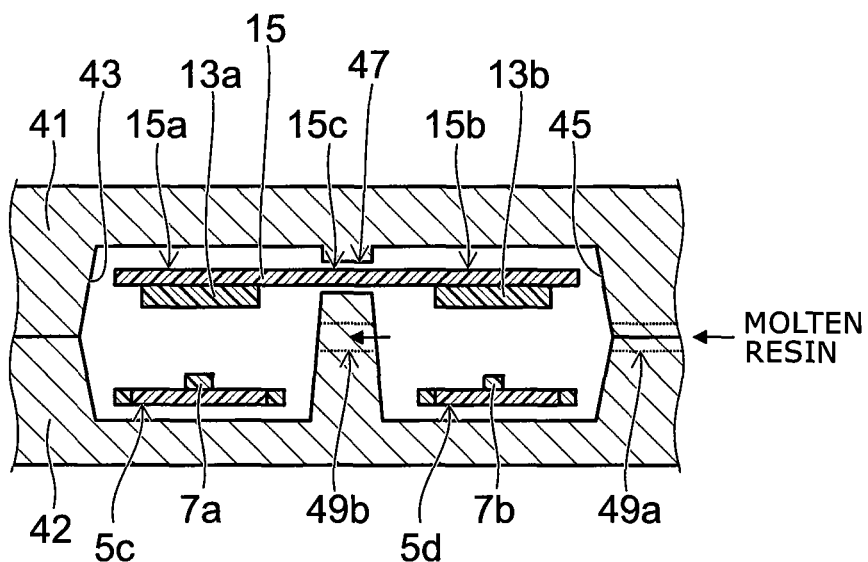

Next, the internal molds 9a and 9b are formed by the molding processes shown in FIGS. 5A and 5B. FIG. 5A is a cross-sectional view showing a state where the lead frame 20 and the lead frame 30 are set to be stacked between an upper die 41 and a lower die 42. FIG. 5B is a cross-sectional view showing a state where the upper die 41 and the lower die 42 are mold-clamped together.

As shown in FIG. 5A, the lead frame 20 and the lead frame 30 are stacked, and are set on the lower die 42. At this time, the light emitting surface 7c of the light emitting element 7a and the light receiving surface 13c of the light receiving element 13a are disposed opposed to each other, and the light emitting surface 7c of the light emitting element 7b and the light receiving surface 13c of the light receiving element 13b are disposed opposed to each other.

Subsequently, the upper die 41 and the lower die 42 are mold-clamped together to form a first cavity 43 and a second cavity 45. The cavity 43 houses a portion of the lead 5a to which the light emitting element 7a is fixed, a portion of the lead 6a to which the wire 21a is bonded, the wire 21a, the mount portion 15a to which the light receiving element 13a is fixed, a portion of the lead 17a to which the wire 22a is bonded, the wire 22a, a portion of the lead 19 to which the wire 23a is bonded, the wire 23a, a portion to which the wire 24a of the mount portion 15a is bonded, and the wire 24a.

The cavity 45 houses a portion of the lead 5b to which the light emitting element 7b is fixed, a portion of the lead 6b to which the wire 21b is bonded, the wire 21b, the mount portion 15b to which the light receiving element 13b is fixed, a portion of the lead 17b to which the wire 22b is bonded, the wire 22b, a portion of the lead 19 to which the wire 23b is bonded, the wire 23b, a portion to which the wire 24b of the mount portion 15b is bonded, and the wire 24b.

Furthermore, the connection portion 15c that is part of the lead 15 between the mount portion 15a and the mount portion 15b is housed in a gap 47 running from the cavity 43 to the cavity 45.

Next, the first resin molten is injected into the cavity 45 via a runner 49a communicating with the cavity 45. Furthermore, in the embodiment, a through gate 49b running from the cavity 45 to the cavity 43 is provided. Thereby, the first resin injected into the cavity 45 moves to the cavity 43, and is put in both of the cavities 43 and 45. The first resin is put also in the gap 47 that houses the connection portion 15c.

At this time, it is also possible to move the molten resin from the cavity 45 to the cavity 43 via the gap 47. However, in the case where the spacing of the gap 47 is made narrow and a thin-film-like resin is molded around the connection portion 15c in order to suppress the crosstalk between channels, the resin may not smoothly move from the cavity 45 to the cavity 43. Therefore, it is preferable to separately provide the through gate 49b for injecting the resin from the cavity 45 to the cavity 43. Furthermore, the runner 49a for injecting the molten resin into the cavity 45 and the through gate 49b are preferably provided at the same height from the bottom surfaces of the cavities 43 and 45. The runner 49a and the through gate 49b are preferably provided so as to be aligned in a straight line in the injection direction of the molten resin.

Subsequently, the resin put in the cavities 43 and 45 is cured to mold the internal molds 9a and 9b. The internal mold 9a is molded in the cavity 43, and the internal mold 9b is molded in the cavity 45. The thin film 9c is formed on the surface of the connection portion 15c.

In the molding processes mentioned above, the connection portion 15c between the mount portion 15a and the mount portion 15b and the connection portion 19a of the lead 19 are housed in the gap 47, and are therefore not caught and pressed between the upper die 41 and the lower die 42. Thereby, the deformation of the lead 15 is suppressed, and the light receiving elements 13a and 13b can be molded in the respective prescribed positions in the internal molds 9a and 9b.

The embodiment illustrates an example in which the internal molds 9a and 9b are molded using dies of what is called a through gate type whereby the molten resin moves from the cavity 43 to the cavity 45 via the through gate 49b. The system of injection molding is not limited thereto, and the arrangement of the runner and the gate may be altered in accordance with the system of the lead frame, for example.

FIGS. 6A to 6C are schematic views showing the internal mold 9a and the internal mold 9b molded. FIG. 6A is a plan view, FIG. 6B is a front view, and FIG. 6C is a cross-sectional view taken along line $V_c$-$V_c$.

As shown in FIG. 6A to FIG. 6C, the leads 5a, 6a, 15, and 17a extend from the internal mold 9a, and the leads 5b, 6b, 17b, and 19 extend from the internal mold 9b. The connection portion 15c and the connection portion 19a covered with the thin film 9c are interposed between the internal mold 9a and the internal mold 9b. Furthermore, a runner portion resin 49c and a through gate portion resin 49d put in the runner 49a and the through gate 49b, respectively, are formed.

Next, the first resin formed around and between the internal molds 9a and 9b is removed. For example, the runner portion resin 49c and the through gate portion resin 49d formed in the portions of the runner 49a and the through gate 49b, respectively, a burr formed during molding, etc. are removed by punching processing using a punching blade matched with the external shapes of the inner molds 9a and 9b. Thereby, between the internal mold 9a and the internal mold 9b, the thin film 9c covering the connection portions 15c and 19a can be left and the surplus resin can be removed.

Figure 7A:
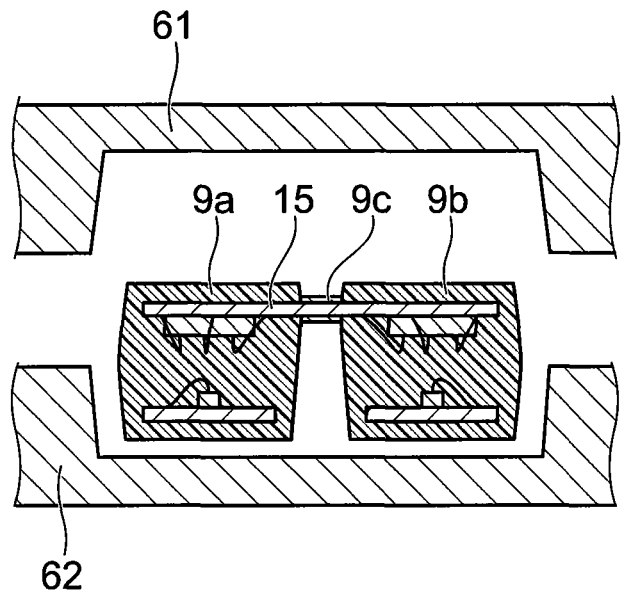
FIGS. 7A and 7B are schematic views subsequent to FIGS. 6A to 6C.
Figure 7B:
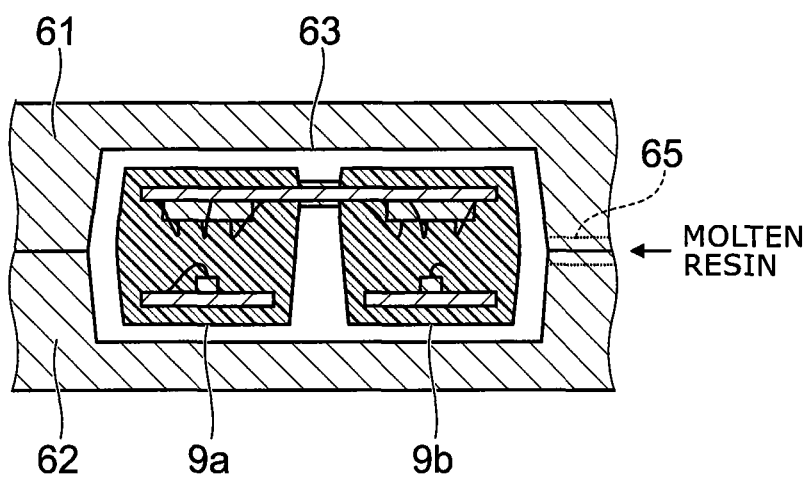

Next, by the molding processes shown in FIGS. 7A and 7B, the external mold 3 that covers the internal mold 9a, the internal mold 9b, and the connection portions 15c and 19a covered with the thin film 9c is molded.

As shown in FIG. 7A, the lead frames 20 and 30 with the internal molds 9a and 9b formed thereon are set on a lower die 62. Subsequently, an upper die 61 and the lower die 62 are mold-clamped to form a cavity 63.

Next, the second resin molten is injected via a runner 65 communicating with the cavity 63. Then, the resin put in the cavity 63 is cured to mold the external mold 3 covering the internal molds 9a and 9b and the thin film 9c. Subsequently, the lead frames 20 and 30 with the external mold 3 molded therearound are taken out of the dies, and the common frames and 33 are cut to produce individually separated semiconductor devices 100.

In the manufacturing processes mentioned above, a hard epoxy resin, for example, may be used as the first resin; thereby, the strength of the connection portions 15c and 19a covered with the thin film 9c can be increased. Thereby, the deformation of the lead frames 20 and 30 with the internal molds 9a and 9b molded thereon can be suppressed, and the quality and manufacturing yield of the semiconductor device 100 can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device comprising:
    preparing a first frame and a second frame,
    the first frame having a first light emitting element and a second light emitting element thereon, and
    the second frame having a first light receiving element and a second light receiving element thereon, the second frame including a connecting portion electrically connecting the first light receiving element and the second light receiving element;
    setting the first frame and the second frame in a die that has a first cavity, a second cavity, a gap in communication with the first cavity and the second cavity, a through gate in communication with the first cavity and the second cavity, and a runner in communication with the second cavity, wherein the first light emitting element and the first light receiving element are placed in the first cavity, the second light emitting element and the second light receiving element are placed in the second cavity, and the connecting portion is placed in the gap;
    forming a first resin body by filling the first cavity, the second cavity, and the gap with a first resin through the runner and the through gate;
    removing parts of the first resin body formed in the runner and the through gate; and
    forming the second resin body that covers the first resin body.

2. The method according to claim 1, wherein the through gate is aligned with the runner in a direction from the first cavity to the second cavity.

3. The method according to claim 1, wherein the second frame includes a lead electrically connected to the first light receiving element and the second light receiving element, wherein the lead is molded in the first resin body.

4. The method according to claim 1, wherein a main composition of the first resin is same as a main composition of the second resin.

5. The method according to claim 1, wherein
    the first resin body transmits a light emitted from the first light emitting element and the second light emitting element; and
    the second resin body contains a member absorbing external light.

6. The method according to claim 1, wherein
    the first resin body transmits a light emitted from the first light emitting element and the second light emitting element; and
    the second resin body contains a member reflecting external light.

7. The method according to claim 1, wherein
    the first light emitting element is disposed in the first resin body so as to face the first light receiving element; and
    the second light emitting element is disposed in the first resin body so as to face the second light receiving element.

* * * * *